United States Patent [19]

Arimura et al.

[11] Patent Number: 4,786,865
[45] Date of Patent: Nov. 22, 1988

[54] METHOD AND APPARATUS FOR TESTING INTEGRATED CIRCUIT SUSCEPTIBILITY TO COSMIC RAYS

[75] Inventors: Itsu Arimura, Mercer Island; Arthur C. Day, Renton, both of Wash.

[73] Assignee: The Boeing Company, Seattle, Wash.

[21] Appl. No.: 835,347

[22] Filed: Mar. 3, 1986

[51] Int. Cl.⁴ .................. G01R 31/26; G01N 23/225
[52] U.S. Cl. ........................... 324/158 R; 324/73 R; 324/158 D; 250/310; 250/311
[58] Field of Search ........... 324/158 R, 158 D, 158 T, 324/71.5; 250/310, 311, 234, 338, 442.1, 492.1

[56] References Cited

U.S. PATENT DOCUMENTS 4,323,842 4/1982 McGarrity et al. ............ 324/158 D
4,455,485 6/1984 Hosaka et al. ................. 250/234 X
4,581,578 4/1986 Honma et al. ................. 324/158 D
4,593,207 6/1986 McRight, Jr. et al. ............ 250/338

FOREIGN PATENT DOCUMENTS 2069152 8/1981 United Kingdom ............ 324/158 R

Primary Examiner—Reinhard J. Eisenzopf
Assistant Examiner—Vinh P. Nguyen
Attorney, Agent, or Firm—Christensen, O'Connor, Johnson & Kindness

[57] ABSTRACT

Apparatus and method for testing the susceptibility of an integrated circuit (10) to single event upsets caused by high energy heavy ions, such as are found in cosmic rays. The integrated circuit is mounted in a three axes manipulator (20) by which it is positioned at a desired target point. A light pulse generated by source (32) is filtered and collimated by spatial filter (34), and is focused as a spot on the integrated circuit by optics (60). Preferably, the diameter of the focused spot is 5 microns or less and its wavelength is in the range of 850-1100 nanometers. The susceptibility of any point on the integrated circuit is determined by operating the circuit and monitoring it for errors after it is subjected to the focused light pulse. Timing of the light pulse may also be controlled with respect to integrated circuit operation, to determine susceptibility as a function of time.

15 Claims, 1 Drawing Sheet

METHOD AND APPARATUS FOR TESTING INTEGRATED CIRCUIT SUSCEPTIBILITY TO COSMIC RAYS

FIELD OF THE INVENTION

The present invention relates to the testing of integrated circuits and, in particular, to a method and apparatus for testing the susceptibility of integrated circuits to bombardment by heavy ion cosmic ray particles.

BACKGROUND OF THE INVENTION

A single cosmic ray particle passing through an integrated circuit can generate an electrical transient that interferes with the normal operation of the circuit. The disruption caused in an integrated circuit by a cosmic ray is termed a single event upset. Single event upsets include changes of state (i.e., bit flips) in memory elements, device latchups and dielectric breakdowns. Latchup occurs when a memory element is stuck in one state and does not respond to a write operation. A latched-up element can be restored to normal function by powering down and then reapplying power, if the latch-up has not caused thermal damage to the device. Dielectric breakdown refers to the creation of a conductive path through an insulator (e.g., silicon nitride) layer. The high current and resulting thermal runaway resulting from a dielectric breakdown can result in the permanent failure of an integrated circuit. Bit flips are less catastrophic events, and the memory element in which the flip occurred can typically be rewritten to eliminate all trace of the upset. Bit flip errors may occur not only in memory devices such as RAM, but also in other integrated circuits that include data storage elements such as flip-flops, registers, counters, and microprocessors. As the speed and packaging density of spaceborne computers, memories, and other integrated circuits improve, the susceptibility of these components to cosmic ray upset increases. Such damage is occurring in the MSI and LSI devices used in the present generation of spacecraft, because no protection against cosmic ray effects was included in their electronic designs.

Cosmic rays are high energy ions, protons and electrons that have a galactic origin. The cosmic ray flux may strike an orbiting spacecraft from all directions and at all hours, and is not related to the position of the spacecraft with respect to the sun or the earth. The cosmic ray particle most likely to produce a single event upset is a heavy ion, i.e., an atomic nucleus with an atomic number greater than two. When an energetic heavy ion (e.g. Fe) particle passes through a semiconductor material, the particle loses energy by a process that creates electron-hole pairs in the semiconductor. Typically, the particle penetrates through the semiconductor material in a straight line path. Electrical interactions result in energy transfer to electrons, producing secondary electrons with a spectrum of energies and traveling in random directions. The secondary electrons spread from the original particle path for a distance of up to a few microns, losing energy by creation of additional electron-hole pairs. The result is a cylindrically shaped path of ionization through the semiconductor, with a diameter on the order of 1–5 microns and with an ionization intensity that varies approximately as $1/r^2$ with distance away from the path center. The process is very rapid, on the order of picoseconds, and may be treated as instantaneous deposition of energy and charge along the path traveled by the heavy ion. In silicon, the creation of each electron-hole pair requires 3.6 electron volts. A loss of 3.6 MeV by a cosmic ray particle will therefore result in the creation of one million electron-hole pairs, or 0.16 picocoulombs.

Integrated circuits represent a bit of binary data as the presence or absence of charge at a particular node (e.g., at a MOS capacitor). The quantity of charge at a node that differentiates between a binary one and a binary zero may be defined as the critical charge. This critical charge is determined by node capacitance and the threshold voltages of associated circuit elements. Typical values for the critical charge in current integrated circuits are 0.01 to 1.0 picocoulombs. The basic mechanism for cosmic ray induced bit errors is the neutralization of the critical charge by the collection at the node of ionization induced electrons or holes. Most electrons and holes that are generated by heavy ion induced ionization within depletion regions surrounding nodes will be separated by the electric field at the node, with electrons being swept to the positive potential, and holes being swept to the negative potential. Charges generated outside the depletion region may diffuse to the edge of the depletion region and be swept into the node.

The rate at which an ion loses energy in passing through a material is described by the linear energy transfer or LET for that ion. For typical diffusion rates, node dimensions and critical charges, an LET on the order of a few MeV/micron is required to deposit the critical charge in the path through the node. The magnitude of the critical charge is a function of circuit parameters, and particularly of the size of the node. Unfortunately, the critical charge decreases rapidly as the feature size of integrated circuits decreases. For example, in many classes of integrated circuits, the critical charge varies as the inverse square of the feature size of a memory cell. As today's VSLI circuits evolve into VHSIC circuits in the future, the feature size will continue to decrease, and susceptibility to single event upsets will become an increasing important property of spaceborne electronics.

It is known that shielding is an ineffective solution to the problem of the single event upsets caused by heavy cosmic rays. The problem is that the amount of shielding required to exclude such cosmic rays would impose an impossible weight penalty on a spacecraft. The use of parallel and redundant systems (e.g., with majority voting) imposes a similar weight penalty, and also poses the problem of how to protect the "voting" electronics. As a result, the best approach to the single event upset problem is to devise integrated circuits that are relatively immune to such upsets. As described above, susceptibility to single event upsets will generally increase with improvements in desirable circuit parameters such as speed, performance, small feature size, high packaging densities and low power consumption. Knowing the susceptibility of an integrated circuit to single event upsets thereby permits a circuit designer to balance single event upset susceptibility with speed and performance in the design of spacecraft electronics.

Theoretical calculations of device susceptibilities are complicated by the fact that charge collection at an integrated circuit node is a complex process that is highly dependent on device structure and bias levels. Furthermore, in multilayer integrated circuits, several nodes may be penetrated by a single cosmic ray particle. Thus, to date, actual testing has proved to be the most effective way to determine device susceptibility. In the past, the testing of integrated circuits for susceptibility to heavy cosmic ray particles has been carried out almost exclusively at high-energy accelerators, such as cyclotron or tandem Van de Graaff accelerators. The cost of using these facilities is high, and the facilities are often located at remote locations. Although laboratory sources exist for protons and alpha particles, no laboratory source can effectively produce high energy heavy ions of the type found in cosmic rays. The collection of data concerning the susceptibility of integrated circuits to the heavy ion component of cosmic rays has therefore been a slow and difficult process.

SUMMARY OF THE INVENTION

The basis of the present invention is that, under appropriate circumstances, a pulse of electromagnetic radiation striking an integrated circuit will produce effects in the integrated circuit that are similar to those produced by a heavy ion cosmic ray particle. Thus, in the practice of the present invention, the high energy accelerator previously used for testing integrated circuits is replaced by a comparatively simple and low cost optical system.

In one aspect, the present invention provides an apparatus for testing the susceptibility of an integrated circuit to single event upsets caused by high energy heavy ions. The term "integrated circuit" as used herein refers to a group of interconnected circuit elements (e.g., transistors) fabricated in place on a semiconductor substrate. The apparatus comprises positioning means for mounting the integrated circuit at a selected position, source means for generating a pulse of light, optical means for focusing the light produced by the source means at a target position on the integrated circuit, and electronic testing means for operating the integrated circuit and monitoring the integrated circuit for errors. In a related aspect, the present invention provides a method for testing integrated circuits for susceptibility to upsets by high energy heavy ions. The method comprises positioning the integrated circuit at a selected position, generating a pulse of light, focusing the pulse of light at a target position on the integrated circuit, and operating the integrated circuit and monitoring it for errors. As used herein, the term "light" refers to electromagnetic radiation in the infrared and visible portions of the spectrum.

The pulse of light is preferably provided by a laser device having a spectral width on the order of 10 nanometers or less, and the pulse of light is preferably focused to a focal spot at the target position having a diameter on the order of 5 microns or less. The wavelength of the light is selected such that the rate of absorption of the light will be substantially constant as the light passes through the active layer of the integrated circuit. In general, wavelengths between 850–1100 nanometers are most suitable. The pulses of light may be produced in response to trigger signals provided by the testing means, such that the timing of the pulses of light with respect to integrated circuit operation may be controlled. A visible light beam may be employed to facilitate positioning of the focal spot at the target position.

The present invention can be used as a means of screening for integrated circuits that are particularly susceptible compared to others of the same type, for determining device types that are most susceptible, for performing diagnostic tests of susceptible errors or operating conditions, or for deliberately creating upsets to calibrate or test measurement equipment. The present invention also provides an inexpensive method for determining the effect of upsets on complex integrated circuits such as microprocessors, where fault detection requires a full scale exercising of the circuit function.

DETAILED DESCRIPTION OF THE INVENTION

Figure 1:
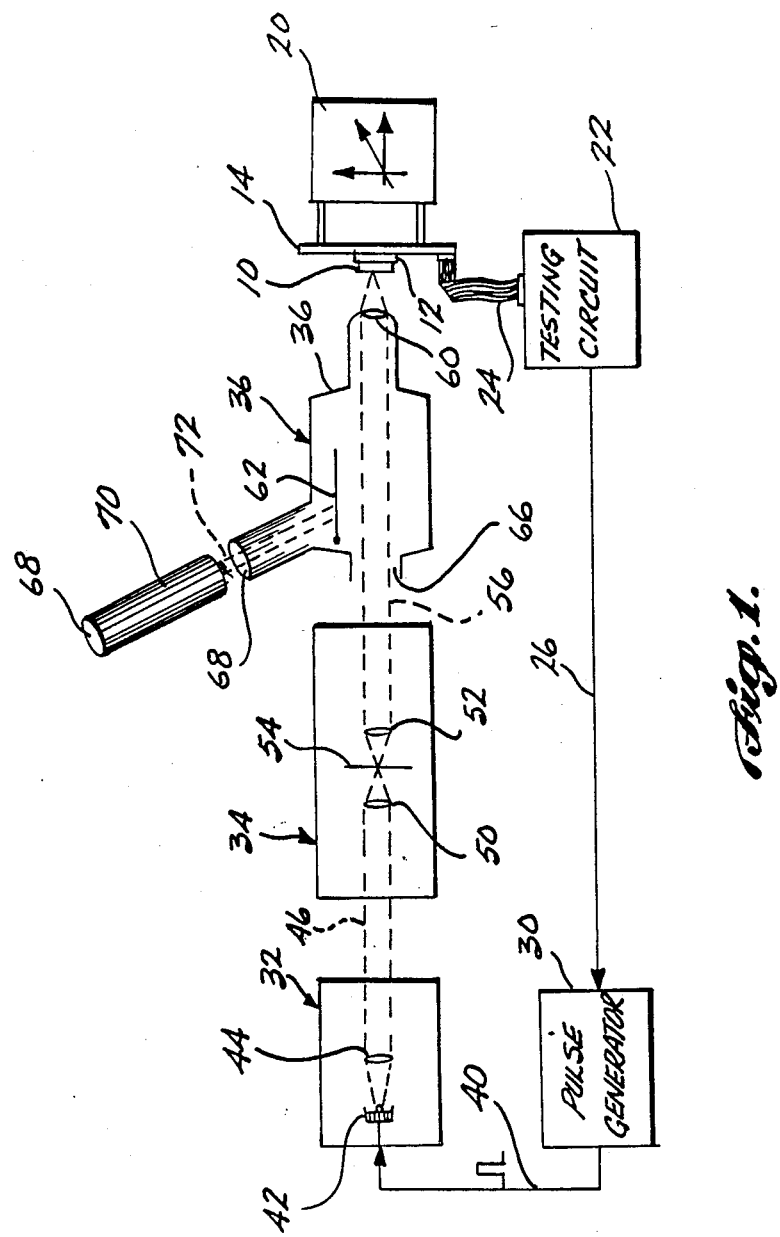

FIG. 1 schematically illustrates a method and apparatus for testing integrated circuits according to the present invention.

In FIG. 1, the integrated circuit 10 to be tested is mounted in socket 12 that, in turn, is secured to circuit board 14. The metal lid or casing of the integrated circuit is removed so as to expose the circuit area. Circuit board 14 is mounted to three-axis manipulator 20 that is capable of precise positioning of the integrated circuit along three axes. The integrated circuit is electronically connected to testing circuit 22 via cable 24. The testing circuit operates the integrated circuit and monitors it for error conditions.

The test apparatus of FIG. 1 includes pulse generator 30, light source 32, spatial filter 34, and microscope stage 36. Pulse generator 30 generates short duration electrical pulses on line 40 that are input to light source 32. Pulse generator 30 may generate pulses asynchronously, or in response to trigger signals from testing circuit 22 over line 26. In the illustrated embodiment, light source 32 comprises laser diode 42 and lens 44. The laser diode is connected to receive the pulses on line 40, and responds by producing corresponding light pulses that are collimated by lens 44 to produce pulsed light beam 46. Spatial filter 34 comprises lenses 50 and 52 and pinhole aperture 54. The spatial filter filters and collimates pulsed light beam 46 and produces pulsed light beam 56 that is directed into microscope stage 36. The microscope stage includes focusing optics 60 and flip-down mirror 62, the purpose of mirror 62 being explained below. Focusing optics 60 focuses pulsed light beam 56 onto a focal spot on integrated circuit 10. The focal spot is preferably as small as possible, to best simulate the narrow ionization track of a high energy heavy cosmic ray particle. The use of a laser for light source 32, together with the use of spatial filter 34, generally permits the production of focal spots having diameters on the order of 5 microns, a size that is suitable for the practice of the present invention. In general, the probability of a single event upset depends upon the total charge integrated over the area normal to the cosmic ray particle path, not on the exact shape of the charge distribution over such area.

The light pulses produced by light source 32 preferably have rise times less than about five nanoseconds and pulse widths on the order of ten nanoseconds, to best simulate the time constant for the set up of a charge distribution in the wake of a heavy ion particle. The actual passage of the heavy ion particle through the semiconductor typically takes far less than one nanosecond. However, the time required for an integrated circuit to respond to the wake of a heavy ion particle varies from a few nanoseconds to about 100 nanoseconds. Pulse widths greater than ten nanoseconds are therefore quite suitable for some applications. Pulse generator 30 may comprise a conventional avalanche transistor driver circuit. Laser diode 42 preferably operates in the range of 850–1100 nanometers, and has a spectral width less than about 10 nanometers. The laser diode should be capable of a moderately high output power, for example, greater than 5 watts at 10 nanoseconds pulse width. The pulse generator and laser diode are preferably capable of a moderate repetition rate, such as 10 pulses per second or greater. A suitable laser diode is a gallium arsenide, single heterojunction laser diode that emits radiation at 905 nanometers. Nondiode laser devices, such as a neodymium doped YAG rod laser (1060 nanometers) may also be used. The main requirements of the light source are very high speeds (pulse rise times less than 5 nanoseconds), narrow spectral width, moderately high power output, and moderate repetition rate capability. Although nonlaser light sources can be used, the operating requirements for the light source will in general be most easily achieved by use of lasers.

Spatial filter 34 is a conventional device, and functions to remove structure from beam 46 and assure uniformity over the focal spot on integrated circuit 10. Microscope stage 36 is a conventional instrument that includes opening 66 that is normally used for a camera attachment, and opening 68 normally used for viewing by an operator. Camera or operator viewing is determined by the position of mirror 62. In FIG. 1, mirror 62 is flipped up in the camera position, such that a direct path is provided between opening 66 and focusing optics 60. When mirror 62 is flipped down, an image formed by focusing optics will be reflected upward through opening 68. In the practice of the present invention, mirror 62 is flipped up to permit illumination of integrated circuit 10 by pulsed light beam 56. Visible light laser 70 (e.g., a helium neon laser) may be positioned to direct visible light beam 72 into opening 68, such that when mirror 62 is flipped down, the visible light beam is focused onto the surface of integrated circuit 10. This feature may be used for positioning the integrated circuit such that a predetermined spot will be illuminated by the pulsed light beam. In general, microscope stage 36 will not focus beams 56 and 72 at the same position on the integrated circuit if the light source 32 operates in the infrared, due to wavelength variations in lens refraction. However, use of a gridded test structure (at the position of integrated circuit 10) permits very precise measurement of the separation of two focal points in three dimensions. Once this separation measurement is made, an operator can focus visible light beam 72 on a region of interest on an integrated circuit, then move the integrated circuit by the measured focal point separation and irradiate the integrated circuit with pulsed light beam 56. As a result, pulsed light from light source 32 can be focused and deposited in very small, well-defined regions, closely simulating the effect of a heavy charged particle. Preferably, three axis manipulator 20 is sufficiently precise to allow accurate positioning to within 5 microns, so that the susceptibility of an integrated circuit can be determined as a function of position of the focal spot with respect to circuit features.

The absorption coefficient of electromagnetic radiation in silicon decreases as the wavelength increases. A similar relationship holds for gallium arsenide. When a high energy cosmic ray passes through an integrated circuit, the cosmic ray particle loses comparatively little of its energy during such a passage, and the particle in effect leaves a constant energy wake along its path through the semiconductor. The wavelength of the laser or other light used to irradiate the integrated circuit is selected to simulate this behavior. In particular, if the wavelength is too long, too little energy will be absorbed in the active layer of the integrated circuit, i.e., in the upper portion (about ten percent) of the semiconductor layer that contains the active circuit elements. If the wavelength is too short, the light energy will be absorbed too rapidly, leading to a broader wake at the beginning of the path through the active layer and a smaller wake towards the end of such path. In general, wavelengths between 850–1100 nanometers are suitable. Preferred wavelengths are 1060 nanometers for silicon and 905 nanometers for gallium arsenide. Once the wavelength is determined, the rate of energy deposition in the active layer may be adjusted by varying the power of the laser or other light source.

Many types of integrated circuits may be conveniently tested by means of the present invention. In such tests, the metal lid or can of the integrated circuit is removed to expose the circuit. The metal grids over the emitter and base regions form a fine pattern that will reflect light. The light beam should therefore be directed to regions where metal coverage is absent. In laboratory tests, the technique of this invention has been used to produce a bit flip in a single target location selected out of 4096 present on a bipolar RAM. This method is also ideally suited for introducing defined faults into complex electronic devices such as microprocessors, to determine the effects of real time operating conditions on fault propagation. For example, the timing of the light pulses produced by light source 32 can be controlled such that they occur at prescribed times in the clock cycle of the microprocessor. Such control is achieved by means of trigger signals input to pulse generator 30 via line 26.

Testing circuit 22 can comprise any of the well-known systems presently being used to test integrated circuits in high-energy accelerators. By way of example, if integrated circuit 10 is a memory device such as a RAM, testing circuit 22 may comprise a computer and an operating program for writing a prescribed bit pattern into the integrated circuit, and then reading the bit pattern after irradiation by one or more light pulses, comparing the resulting bit pattern with the initial bit pattern, and identifying and storing any errors that are detected. For more complex integrated circuits such as microprocessors, testing circuit 22 may comprise a controller that either tests the outputs of integrated circuit 10 by comparing such outputs to "true" values stored in the controller's memory, or by comparing the outputs to the outputs of an identical microprocessor operating the same program but not subjected to irradiation. Other variations are also possible, and are well known in the art related to accelerator testing of integrated circuits. When the integrated circuit being tested is a microprocessor, the microprocessor clock frequency may be varied to suit the test requirements.

While the preferred embodiments of the invention have been illustrated and described, it should be understood that variations will be apparent to those skilled in the art. Accordingly, the invention is not to be limited to the specific embodiments illustrated and described, and the true scope and spirit of the invention are to be determined by reference to the following claims.

The embodiments of the invention in which an exclusive property or privilege is claimed are defined as follows:

1. An apparatus for testing the susceptibility of an integrated circuit to single event upsets caused by high energy heavy ions, comprising:

positioning means for mounting the integrated circuit at a selected position;

source means for generating a pulse of light having sufficient power to simulate the effect on the integrated circuit that would be caused by impact of high energy heavy ions;

optical means for focusing the pulse of light produced by the source means at a target position on the integrated circuit mounted by the positioning means; and, electronic testing means for operating the integrated circuit and monitoring the integrated circuit to determine whether a single event upset has been caused by the pulse of light.

2. The apparatus of claim 1, wherein the source means comprise a laser device having a spectral width on the order of 10 nanometers or less, and wherein the optical means is operative to focus the light produced by the source means to a focal spot at the target position, the diameter of the focal spot being on the order of 5 microns or less.

3. The apparatus of claim 2, wherein the positioning means are operative to position the integrated circuit at the selected position to an accuracy of within 5 micrometers, for testing the susceptibility of particular portions of the integrated circuit.

4. The apparatus of claim 3, further comprising means for generating a visible light beam for use in determining the target position where the pulse of light will strike the integrated circuit, and wherein the optical means comprise means for selectively focusing either the visible light beam or the light produced by the source means at the target position.

5. The apparatus of claim 1, wherein the light produced by the source means has a wavelength selected such that energy associated with light of that wavelength will be absorbed at a substantially constant rate along the path of the light through an active layer of the integrated circuit.

6. The apparatus of claim 5, wherein the wavelength of the pulse of light is in the range 850–1,100 nanometers.

7. The apparatus of claim 1, wherein the pulse of light has a rise time of less than about 5 nanoseconds, and a pulse width of less than about 10 nanoseconds.

8. The apparatus of claim 1, wherein the electronic testing means are operative to produce trigger signals, and wherein the source means are operative to produce light pulses in response to such trigger signals.

9. A method for testing the susceptibility of an integrated circuit to single event upsets caused by high energy heavy ions, the method comprising:

positioning the integrated circuit at a selected position;

generating a pulse of light having sufficient power to simulate the effect on the integrated circuit that would be caused by impact of high energy heavy ions;

focusing the pulse of light at a target position on the integrated circuit; and operating the integrated circuit and monitoring the integrated circuit to determine whether a single event upset has been caused by the pulse of light.

10. The method of claim 9, wherein the pulse of light is focused to a focal spot at the target position, the diameter of the focal spot being on the order of 5 microns or less.

11. The method of claim 10, comprising the further steps of focusing a visible light beam at a visible focal spot, determining the separation between the focal spot and the visible focal spot, and utilizing said separation as a guide to focusing the light at the target position.

12. The method of claim 9, wherein the light has a wavelength selected such that energy associated with light of that wavelength will be absorbed at a substantially constant rate along the path of the light through an active layer of the integrated circuit.

13. The method of claim 12, wherein the wavelength of the pulse of light is in the range of 850–1100 nanometers.

14. The method of claim 9, wherein the pulse of light has a rise time of less than about five nanoseconds, and a pulse width of less than about ten nanoseconds.

15. The method of claim 9, wherein the pulse of light is generated at a prescribed time with respect to the operation of the integrated circuit.

* * * * *